US011540426B2

United States Patent
Nakano et al.

(10) Patent No.: US 11,540,426 B2
(45) Date of Patent: Dec. 27, 2022

(54) SEMICONDUCTOR DEVICE HAVING A SWITCHING ELEMENT AND A DIODE CONNECTED IN ANTIPARALLEL

(71) Applicant: TOSHIBA MITSUBISHI-ELECTRIC INDUSTRIAL SYSTEMS CORPORATION, Chuo-ku (JP)

(72) Inventors: Toshihide Nakano, Chuo-ku (JP); Kenji Suzuki, Chuo-ku (JP); Koki Nakamura, Chuo-ku (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 97 days.

(21) Appl. No.: 16/973,992

(22) PCT Filed: Jun. 12, 2018

(86) PCT No.: PCT/JP2018/022420
§ 371 (c)(1),
(2) Date: Dec. 10, 2020

(87) PCT Pub. No.: WO2019/239484
PCT Pub. Date: Dec. 19, 2019

(65) Prior Publication Data
US 2021/0112688 A1    Apr. 15, 2021

(51) Int. Cl.
| | |
|---|---|
| H05K 7/20 | (2006.01) |
| H02M 1/32 | (2007.01) |
| H02M 7/217 | (2006.01) |

(52) U.S. Cl.
CPC .......... *H05K 7/20909* (2013.01); *H02M 1/32* (2013.01); *H02M 7/217* (2013.01); *H02M 1/327* (2021.05)

(58) Field of Classification Search
CPC ........ H02M 1/32; H02M 7/217; H02M 1/327; H05K 7/20909
See application file for complete search history.

(56) References Cited

U.S. PATENT DOCUMENTS

2011/0299265 A1* 12/2011 Nakatsu ................ H01L 25/072
361/820
2014/0063747 A1    3/2014 Sotome et al.
(Continued)

FOREIGN PATENT DOCUMENTS

| JP | 2004-31485 A | 1/2004 |
|---|---|---|
| JP | 2012-5194 A | 1/2012 |

(Continued)

OTHER PUBLICATIONS

Indian Office Action dated Mar. 15, 2021 in Indian Patent Application No. 202017054852, 4 pages.
(Continued)

*Primary Examiner* — Rafael O De Leon Domenech
(74) *Attorney, Agent, or Firm* — Oblon, McClelland, Maier & Neustadt, L.L.P.

(57) ABSTRACT

The semiconductor device according to the present invention includes a semiconductor module, a cooling member, and a heat transfer member. The semiconductor module includes a switching element and a diode connected in antiparallel to each other. The heat transfer member is disposed between the semiconductor module and the cooling member so as to transfer heat generated by the switching element and the diode to the cooling member. The heat transfer member has a mounting surface on which the switching element and the diode are mounted side by side and a surface which is opposite to the mounting surface and is disposed in contact with the cooling member. In the heat transfer member, the thermal conductivity in a first direction
(Continued)

parallel to the mounting surface is higher than the thermal conductivity in a second direction perpendicular to the mounting surface.

5 Claims, 5 Drawing Sheets

(56) References Cited

U.S. PATENT DOCUMENTS

2020/0013752 A1* 1/2020 Nakamura ............ H02M 7/003
2020/0288562 A1* 9/2020 Okagawa ............... H05K 7/209

FOREIGN PATENT DOCUMENTS

| JP | 2014-49516 A | 3/2014 |
| JP | 2015-15351 A | 1/2015 |

OTHER PUBLICATIONS

Japanese Office Action dated Apr. 13, 2021 in Japanese Patent Application No. 2020-524981 (with unedited computer generated English translation), citing document AO therein, 5 pages.
International Preliminary Report on Patentability and Written Opinion dated Dec. 15, 2010 in PCT/JP2018/022420, (with English translation), citing documents AO and AP therein, 4 pages.
International Search Report dated Aug. 28, 2018 in PCT/JP2018/022420, citing documents AO and AP therein, 1 page.
Notification of Reason for Refusal dated Feb. 21, 2022, in Korean Patent Application No. 10-2021-7000727 (with English language translation), 8 pages.

* cited by examiner

SEMICONDUCTOR DEVICE HAVING A SWITCHING ELEMENT AND A DIODE CONNECTED IN ANTIPARALLEL

TECHNICAL FIELD

The present invention relates to a semiconductor device.

BACKGROUND ART

For example, Japanese Patent Laying-Open No. 2012-5194 (PTL 1) discloses a power converter including a semiconductor module that includes a switching element and a rectifying element, a cooler that cools the semiconductor module, and a mounting member that is disposed between the semiconductor module and the cooler so as to connect the semiconductor module and the cooler and transfer heat therebetween.

In the power converter, depending on the operating state, a heat unbalance may be present between heat generated by the switching element and heat generated by the rectifying element. In order to ensure constant cooling against the heat unbalance between the switching element and the rectifying element, it is required that the cooling capacity is large enough to cool each element even when each element is generating a maximum amount of heat. Therefore, the cooler has to be made larger in size.

As a technical solution, in PTL 1, the mounting member is configured to include at least two fillers having different thermal conductivity. One filler having a relatively high thermal conductivity is disposed between the cooler and an element that generates a larger amount of heat, and the other filler having a relatively low thermal conductivity is disposed between the cooler and an element that generates a smaller amount of heat.

CITATION LIST

Patent Literature

PTL 1: Japanese Patent Laying-Open No. 2012-5194

SUMMARY OF INVENTION

Technical Problem

In PTL 1, gas (for example, air) and liquid (for example, water) are used as the two fillers having different thermal conductivity, and the two fluids are filled in a sealed space formed inside the mounting member which has a certain thickness. The arrangement of the fillers is realized by moving the two fluids in the sealed space by using an inertial force generated at the time of acceleration and deceleration of the vehicle on which the power converter is mounted.

Since the technology described in PTL 1 uses a variation in the inertial force during the traveling of the vehicle, the application of the technology in the power converter is limited. Therefore, it is required to improve the cooling efficiency of the semiconductor module with a simple configuration.

Therefore, a main object of the present invention is to provide a semiconductor device capable of improving the cooling efficiency of a semiconductor module with a simple configuration.

Solution to Problem

A semiconductor device according to the present invention includes a semiconductor module, a cooling member, and a heat transfer member. The semiconductor module includes switching elements and diodes connected in antiparallel to each other. The cooling member cools the semiconductor module. The heat transfer member is disposed between the semiconductor module and the cooling member so as to transfer heat generated by the switching element and the diode to the cooling member. The heat transfer member has a mounting surface on which the switching element and the diode are mounted side by side and a surface which is located opposite to the mounting surface and disposed in contact with the cooling member. In the heat transfer member, the thermal conductivity in a first direction parallel to the mounting surface is higher than the thermal conductivity in a second direction perpendicular to the mounting surface.

Advantageous Effects of Invention

According to the semiconductor device of the present invention, it is possible to improve the cooling efficiency of the semiconductor module with a simple configuration.

DESCRIPTION OF EMBODIMENTS

Figure 1:
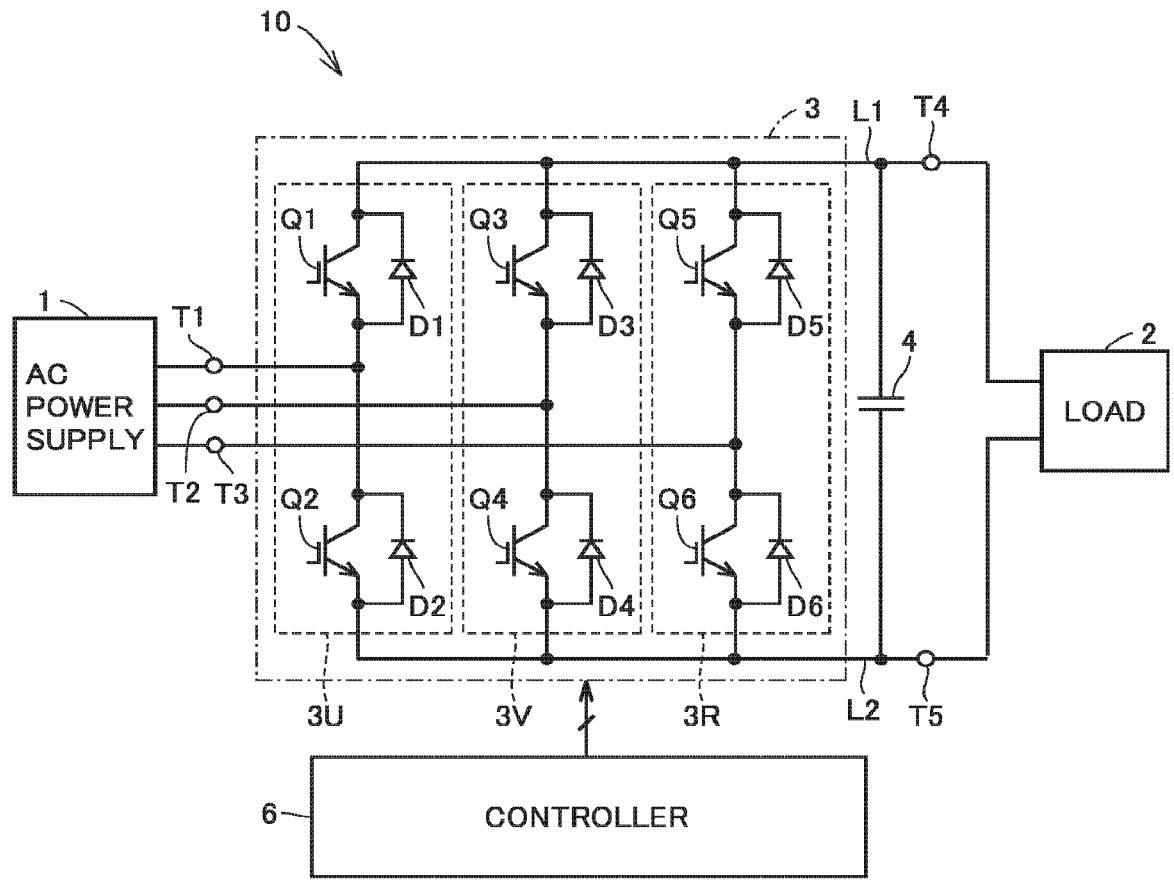
FIG. 1 is a circuit block diagram illustrating an example configuration of a power converter to which a semiconductor device according to an embodiment of the present invention is applied.

Hereinafter, an embodiment of the present invention will be described in detail with reference to the drawings. In the following description, the same or corresponding portions are denoted by the same reference numerals, and the description thereof will not be repeated.

FIG. 1 is a circuit block diagram illustrating an example configuration of a power converter to which a semiconductor device according to an embodiment of the present invention is applied.

With reference to FIG. 1, a power converter 10 includes AC input terminals T1 to T3 and DC output terminals T4 and T5. The AC input terminals T1 to T3 receive three-phase AC power of a commercial frequency from an AC power supply 1. The DC output terminals T4 and T5 are connected to a load 2. The load 2 is driven by the DC power supplied from the power converter 10.

The power converter 10 further includes a converter 3, a DC positive bus L1, a DC negative bus L2, a capacitor 4, and a controller 6. The converter 3 is controlled by the controller 6 and configured to convert the three-phase AC power supplied from the commercial AC power source into DC power and output the DC power to the DC positive bus L1 and the DC negative bus L2.

The converter 3 includes three leg circuits 3U, 3V and 3W. The leg circuits 3U, 3V and 3W are connected in parallel between the DC positive bus L1 and the DC negative bus L2. Each of the leg circuits 3U, 3V and 3W includes two switching elements connected in series and two diodes.

Specifically, the leg circuit 3U includes a switching element Q1 connected between the DC positive bus L1 and the AC input terminal T1, a switching element Q2 connected between the AC input terminal T1 and the DC negative bus L2, and diodes D1 and D2. Each of the switching elements Q1 to Q6 may be constituted by a self-arc-extinguishing type switching element such as an IGBT (Insulated Gate Bipolar Transistor) or a GCT (Gate Commutated Turn-off) thyristor. Diodes D1 and D2 are freewheeling diodes (FWD), and are connected in antiparallel to the switching elements Q1 and Q2, respectively.

The leg circuit 3V includes a switching element Q3 connected between the DC positive bus L1 and the AC input terminal T2, a switching element Q4 connected between the AC input terminal T2 and the DC negative bus L2, and diodes D3 and D4. The leg circuit 3W includes a switching element Q5 connected between the DC positive bus L1 and the AC input terminal T3, a switching element Q6 connected between the AC input terminal T3 and the DC negative bus L2, and diodes D5 and D6. In the following description, if necessary, the switching elements Q1 to Q6 and the diodes D1 to D6 may be collectively referred to as the switching element Q and the diode D, respectively.

The controller 6 operates in synchronization with the AC voltage across the AC input terminals T1 to T3 and controls the converter 3 such that a DC voltage VDC between the DC output terminals T4 and T5 becomes a target DC voltage VDCT. In other words, the controller 6 controls the six switching elements Q1 to Q6, converts the DC voltage VDC between the DC output terminals T4 and T5 into a three-phase AC voltage, and outputs the three-phase AC voltage across the AC input terminals T1 to T3. At this time, the controller 6 controls the six switching elements Q1 to Q6 so that an Ac current flowing through the AC input terminals T1 to T3 has a substantially sine wave shape and has the same phase as the AC voltage across the AC input terminals T1 to T3, thereby makes the power factor approximately equal to 1.

Each of the three leg circuits 3U, 3V and 3W included in the converter 3 is constituted by a semiconductor module. Hereinafter, an example configuration of a semiconductor module will be described in detail.

Figure 2:
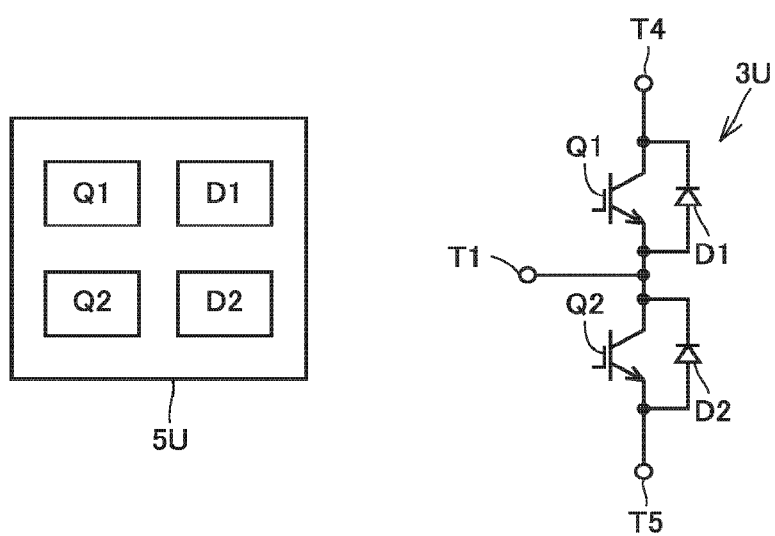
FIG. 2 is a schematic plan view illustrating an example configuration of a semiconductor module.

FIG. 2 is a schematic plan view illustrating an example configuration of a semiconductor module.

Three semiconductor modules 5U, 5V and 5W are provided corresponding to the three leg circuits 3U, 3V and 3W in the example of FIG. 1, respectively. Since the configuration of the semiconductor module of each phase is the same, the configuration of a U-phase semiconductor module 5U will be described with reference to FIG. 2.

The semiconductor module 5U is constituted by mounting the switching elements Q1, Q2 and the diodes D1, D2 on a flat substrate. The switching elements Q1, Q2 and the diodes D1, D2 are electrically connected by a bonding wire or a wiring layer formed from a conductor (not shown). The switching elements Q1, Q2 and the diodes D1, D2 are sealed in resin together with the substrate, the wiring layer, the bonding wire, and the like.

In the example of FIG. 2, the semiconductor module 5U is constituted by two switching elements and two diodes, and alternately, the semiconductor module may be constituted by four switching elements and four diodes. In the latter case, two switching elements and two diodes are connected in parallel to each other.

Figure 3:
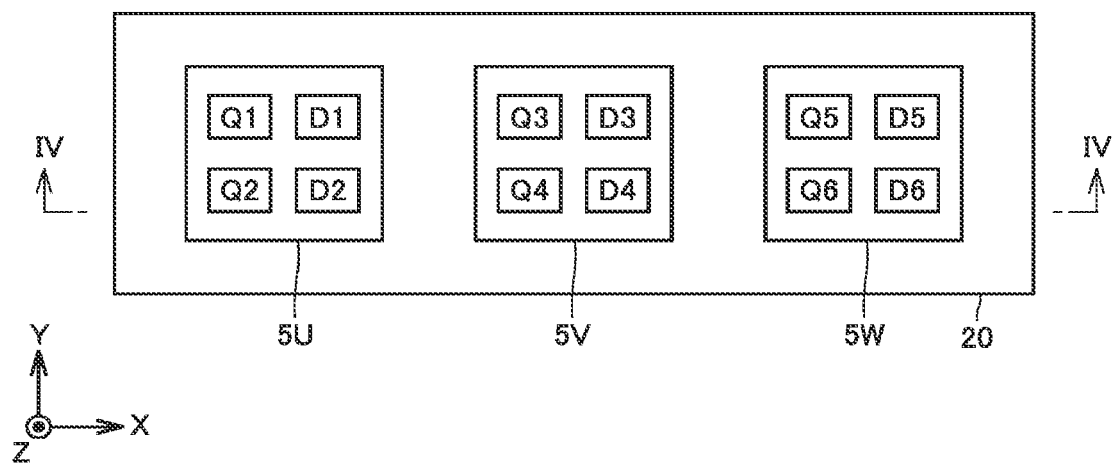
FIG. 3 is a schematic plan view illustrating an example arrangement of three semiconductor modules.
Figure 4:
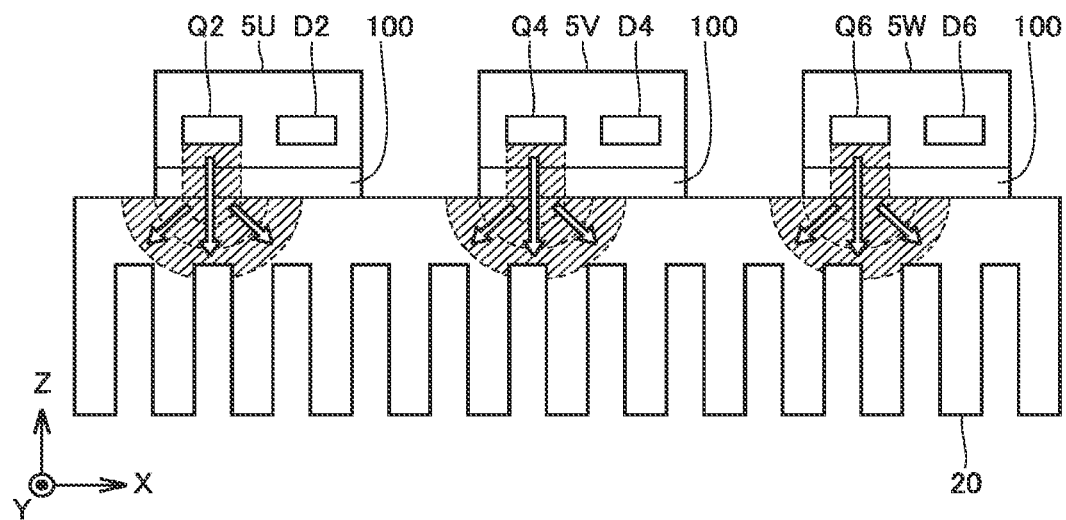
FIG. 4 is a cross-sectional view taken along line IV-IV of FIG. 3.

FIG. 3 is a schematic plan view illustrating an example arrangement of three semiconductor modules 5U, 5V and 5W. FIG. 4 is a cross-sectional view taken along line IV-IV of FIG. 3.

The semiconductor modules 5U, 5V and 5W are mounted side by side on a base portion of a cooling fin 20. A heat transfer member 100 is provided between each of the semiconductor modules 5U, 5V and 5W and the cooling fin 20. The heat transfer member 100 is formed by adding a metal having high thermal conductivity such as silver, copper or aluminum, or a ceramic having high thermal conductivity such as alumina, aluminum nitride, silicon carbide or graphite as a filler to an insulating resin such as a silicon-based resin. The heat transfer member 100 may be a heat transfer grease, a heat transfer sheet, or a thermally conductive adhesive. The heat transfer member 100 fills the gap between the semiconductor module 5 and the cooling fin 20 so as to efficiently transfer heat from the semiconductor module 5 to the cooling fin 20.

Each of the semiconductor modules 5U, 5V and 5W may suffer from a loss such as conduction loss and switching loss in the switching element Q and the diode D during operation, and due to the loss, heat may be generated in the switching element Q and the diode D.

In the power converter 10 having a high power factor, most of the current flows through the switching element Q during the operation, and thus, the heat generation is concentrated on the switching element Q. As a result, in each of the semiconductor modules 5U, 5V and 5W, the amount of heat generated in the switching element Q tends to be greater than the amount of heat generated in the diode D. When the junction temperature of the switching element Q rise beyond the rated temperature due to the heat generation, the switching element Q may be destroyed. Thus, the switching element Q must be made to operate under cooling.

In the example of FIG. 4, as indicated by arrows, heat generated in the switching element Q is transferred from the semiconductor module to the cooling fin 20 through the heat transfer member 100, and is radiated from the cooling fin 20 to the outside. As illustrated in FIG. 4, the heat of the switching element Q is transferred to the heat transfer member 100 and the cooling fin 20 located directly under the switching element Q. Therefore, a heat radiation path is formed mainly between the switching element and the cooling fin 20 in the vertical direction.

However, it is concerned that the heat is less likely to be transferred to the heat transfer member 100 and the cooling fin 20 located directly under the diode D having a smaller amount of heat generation or between two adjacent switching elements Q, and as a result, the heat radiation ability of the cooling fin 20 may not be effectively utilized.

Next, the configuration of the power converter 10 according to the present embodiment will be described with reference to FIG. 5.

Figure 5:
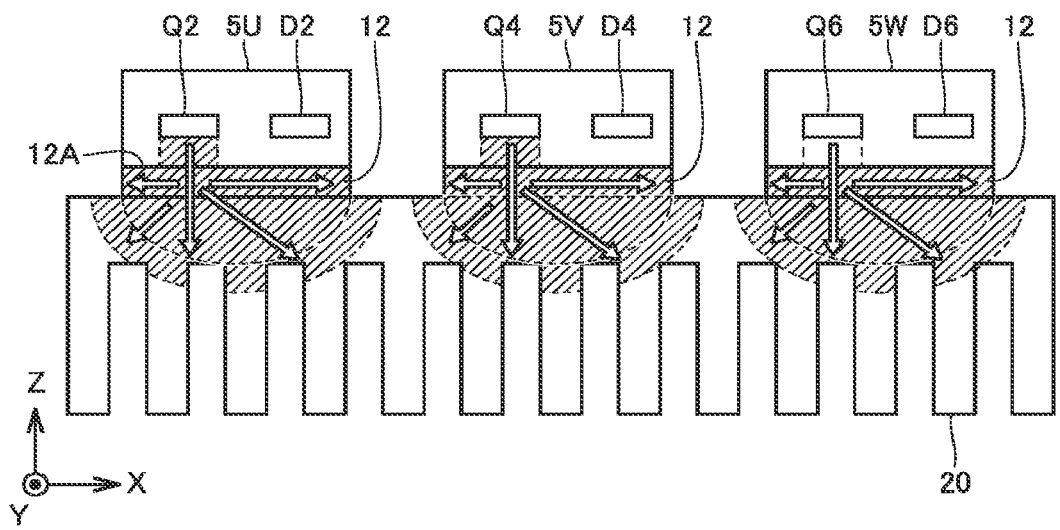
FIG. 5 is a cross-sectional view of the power converter according to the present embodiment.

FIG. 5 is a cross-sectional view illustrating the power converter 10 according to the present embodiment in comparison with that illustrated in FIG. 4. Since the schematic plan view of the power converter 10 and the semiconductor module 5 according to the present embodiment are the same as that illustrated in FIGS. 1 and 2, respectively, the detailed description thereof will not be repeated.

With reference to FIG. 5, in the power converter 10 according to the present embodiment, a heat transfer member 12 is used instead of the heat transfer member 100. The heat transfer member 12 has a mounting surface 12A on which the switching element Q and the diode D are mounted side by side, and a surface (hereinafter, also referred to as a back surface) which is located opposite to the mounting surface and disposed in contact with the cooling fin 20.

The heat transfer member 12 is configured such that the thermal conductivity in a first direction parallel to the mounting surface 12A is higher than the thermal conductivity in a second direction perpendicular to the mounting surface 12A. In the example of FIG. 5, the first direction is a direction parallel to the X-Y plane, and the second direction is the Z direction. In the present specification, the thermal conductivity $\lambda$, is defined as the amount of energy transferred as heat in the heat transfer member 12 according to a temperature gradient. The unit of the thermal conductivity $\lambda$ [W/m·K]. If the thermal conductivity in the first direction is denoted by $\lambda h$, and the thermal conductivity in the second direction is denoted by $\lambda v$, the thermal conductivity of the heat transfer member 12 satisfies the relationship of $\lambda h > \lambda v$.

As the heat transfer member 12, for example, a graphite sheet may be used. The graphite sheet is made of graphite having a layered crystal structure, and has a characteristic that the thermal conductivity in the sheet direction (the direction in which the graphite sheet extends) is higher (about 200 times) than the thermal conductivity in the thickness direction of the graphite sheet (the direction perpendicular to the graphite sheet). In the present embodiment, the above-described relationship between the thermal conductivity $\lambda h$ and the thermal conductivity $\lambda v$ is realized by setting the sheet direction of the graphite sheet as the first direction of the heat transfer member 12 and setting the thickness direction of the graphite sheet as the second direction of the heat transfer member 12.

With such a configuration, when the heat generated in the switching element Q is transferred from the semiconductor module 5 to the heat transfer member 12, the heat is transferred both in the Z direction (the second direction) and in the direction parallel to the X-Y plane (the first direction) as indicated by arrows in FIG. 5. Therefore, the heat may be transferred to the cooling fin 20 through the heat transfer member 12 located directly under the diode D having a small amount of heat generation or between two adjacent switching elements Q. As a result, the heat radiation ability of the cooling fin 20 may be effectively utilized, which thereby improves the cooling efficiency of the semiconductor module 5.

Next, a preferable shape of the heat transfer member 12 illustrated in FIG. 5 will be discussed. The size (in other words, the area) of the mounting surface 12A of the heat transfer member 12 is generally determined by the footprint of each of the semiconductor modules 5U, 5V and 5W. Therefore, in the following, the thickness of the heat transfer member 12 in the second direction will be mainly discussed.

Figure 6:
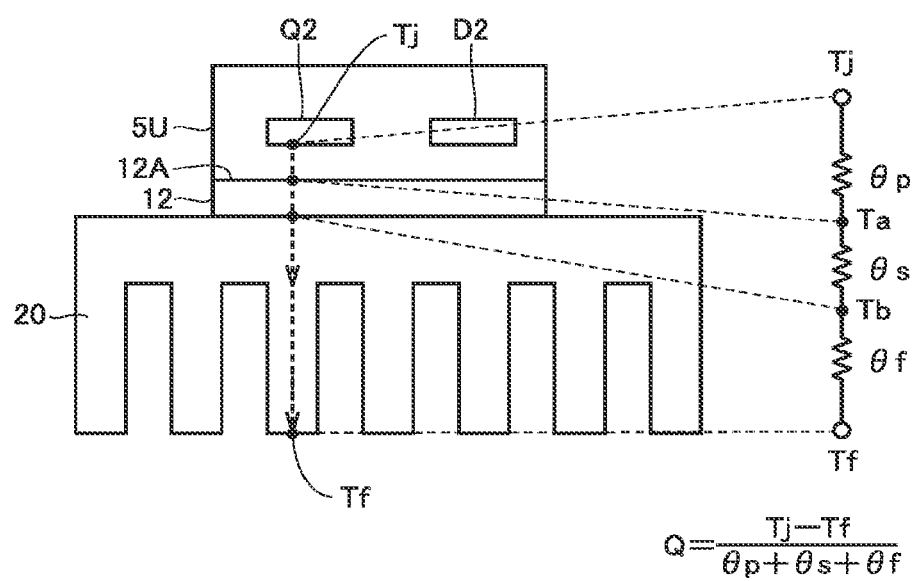
FIG. 6 is a diagram schematically illustrating a heat radiation path of a switching element in the semiconductor module.

FIG. 6 schematically illustrates a heat radiation path of the switching element Q2 in the semiconductor module 5U in broken line arrows. The heat generated in the switching element Q2 is transferred from the semiconductor module 5U to the cooling fin 20 via the heat transfer member 12, and is radiated from the cooling fin 20 to the outside.

In FIG. 6, the junction temperature of the switching element Q2 is denoted by Tj, the surface temperature of the cooling fin 20 is denoted by Tf [K], the mounting surface temperature of the heat transfer member 12 is denoted by Ta [K], and the back surface temperature of the heat transfer member 12 is denoted by Tb [K]. The thermal resistance between the junction temperature Tj of the switching element and the surface temperature Tf of the cooling fin may be expressed by the sum of the thermal resistance $\theta p$ between the junction temperature Tj and the mounting surface temperature Ta, the thermal resistance $\theta s$ between the mounting surface temperature Ta and the back surface temperature Tb, and the thermal resistance $\theta f$ between the back surface temperature Tb and the surface temperature Tf ($=\theta p + \theta s + \theta f$).

If the sum of the thermal resistance ($\theta p + \theta s + \theta f$) is low, the heat generated in the switching element Q2 is quickly radiated. On the other hand, if the sum of the thermal resistance is high, the heat is restrained inside the semiconductor module 5U, and thereby, the temperature of the switching element Q2 rises. If the junction temperature Tj exceeds the upper limit, the switching element Q2 may not operate normally or the switching element Q2 may be destroyed.

Therefore, in the present embodiment, the attention is paid to the heat transfer member 12 in the heat radiation path so as to determine a suitable thickness for reducing the thermal resistance $\theta s$ between the mounting surface temperature Ta and the back surface temperature Tb.

Figure 7:
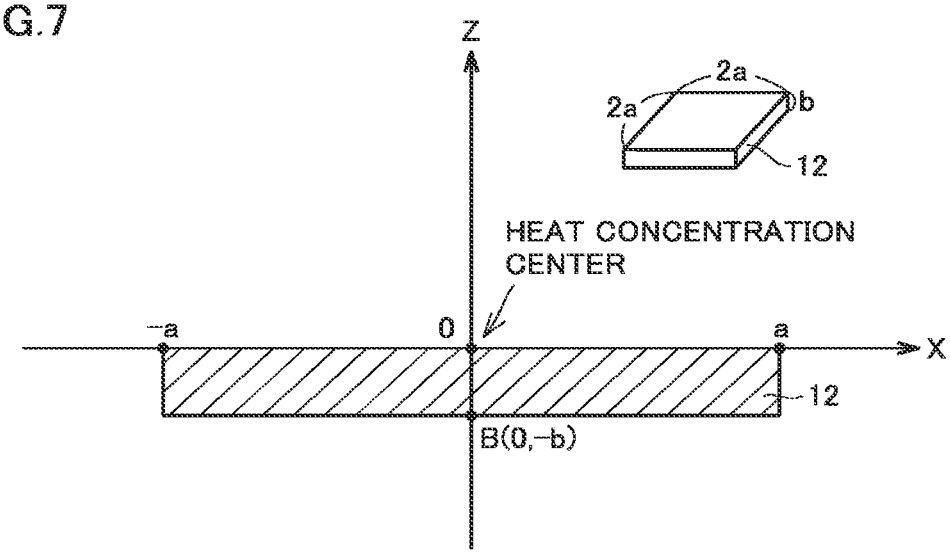
FIG. 7 is a schematic view illustrating a heat transfer member.

FIG. 7 is a schematic view of the heat transfer member 12 used in the investigation. For simplicity, suppose that the heat transfer member 12 has a cubic shape. The mounting surface (the X-Y plane) of the heat transfer member 12 has a square shape with a side length of 2a [mm]. The thickness of the heat transfer member 12 in the second direction (the Z direction) is b [mm].

In the heat transfer member 12, if the thermal resistance in the X direction is denoted by $\theta h$ [K/W], $\theta h$ satisfies the following expression (1):

$$\theta h = a / (\lambda h \cdot 2a \cdot b) \tag{1}$$

In addition, if the thermal resistance in the Z direction is denoted by $\theta v$ [K/W], $\theta v$ satisfies the following expression (2).

$$\theta v = b / (\lambda v \cdot a \cdot a) \tag{2}$$

As can be seen from the expressions (1) and (2), when the thickness b of the heat transfer member 12 becomes greater, the thermal resistance $\theta h$ in the X direction decreases, whereas the thermal resistance $\theta v$ in the Z direction increases. In other words, the heat transfer member 12 has a trade-off relationship in which the thermal resistance $\theta h$ in the direction parallel to the X-Y plane (the first direction) decreases whereas the thermal resistance $\theta v$ in the second direction increases when the thickness b in the Z direction (the second direction) becomes greater.

Thus, when the thickness b of the heat transfer member 12 becomes greater, it is possible to dissipate more heat in the direction parallel to the X-Y plane, but it is difficult to dissipate heat in the Z direction. Therefore, in order to improve the cooling efficiency of the semiconductor module 5 by taking advantage of the characteristics of the heat transfer member 12, it is necessary to determine the thickness b of the heat transfer member 12 so that the thermal resistance $\theta s$ between the mounting surface temperature Ta and the back surface temperature Tb is minimum.

Figure 8:
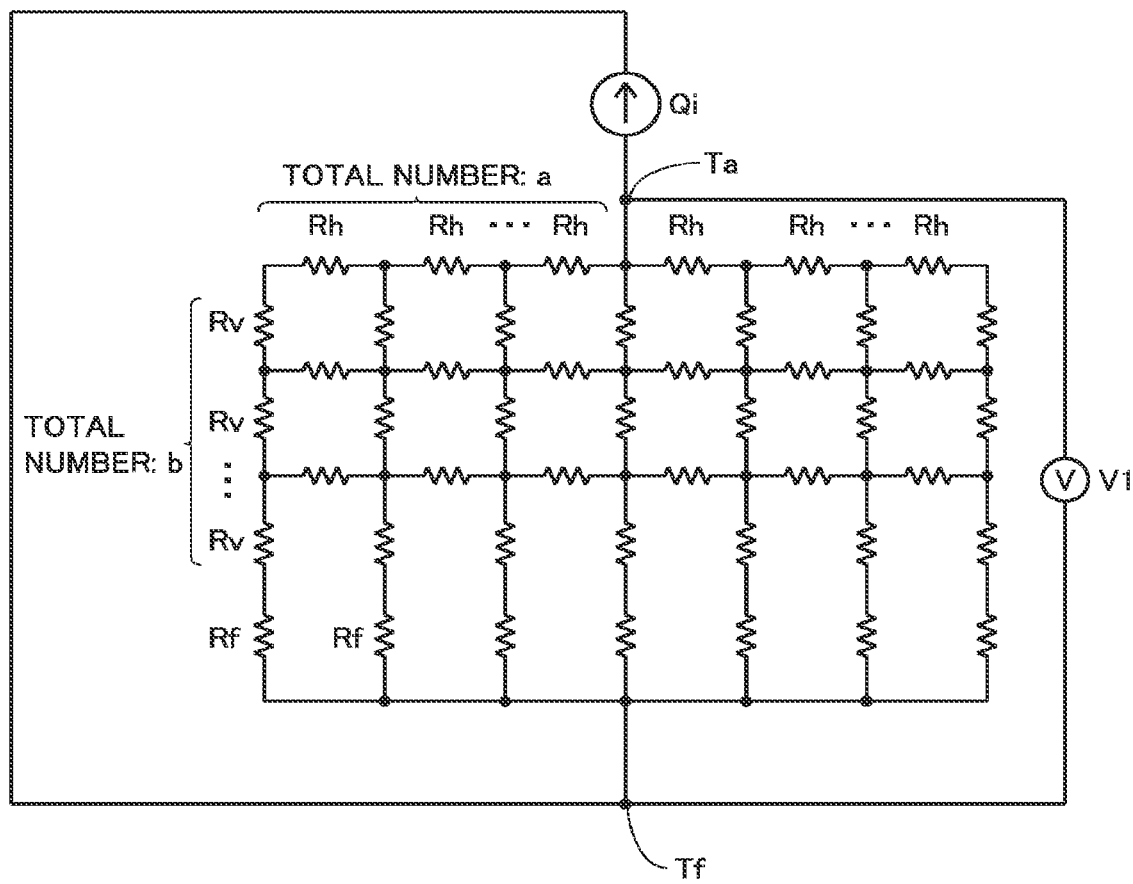
FIG. 8 is a diagram illustrating a thermal network model.

In order to determine the optimal thickness b of the heat transfer member 12, in the present embodiment, a thermal network model is created using a ladder-type resistor circuit as illustrated in FIG. 8. In this thermal network model, Qi denotes the amount of heat generated in the switching element Q, and V1 denotes the temperature difference between the mounting surface temperature Ta and the cooling fin surface temperature Tf. For simplicity, it is considered that the heat generation is concentrated at a center point of the mounting surface of the heat transfer member 12 (corresponding to the origin in FIG. 7), and only the X direction of the heat conduction in the X-Y plane is discussed.

As illustrated in FIG. 8, the thermal resistance per unit area (1 mm$^2$) in the first direction of the heat transfer member 12 is denoted by a resistance value Rh [K/W·mm$^2$], the thermal resistance per unit area in the second direction of the heat transfer member 12 is denoted by a resistance value Rv [K/W·mm$^2$], and the thermal resistance per unit area in the second direction of the cooling fin 20 is denoted by a resistance value Rf [K/W·mm$^2$]. The magnitude of the resistance value Rh or Rv is determined by the material of the heat transfer member 12 (mainly the thermal conductivity λh or λv of the heat transfer member 12), and the magnitude of the resistance value Rf is determined by the material of the cooling fin 20 (mainly the thermal conductivity of the cooling fin 20).

In the thermal network model illustrated in FIG. 8, a number a of resistors each having a resistance value Rh are connected in series along the positive direction and the negative direction in the X direction. The number a of resistors each having a resistance value Rh is determined by the size of the mounting surface of the heat transfer member 12. A number b of resistors each having a resistance value Rv are connected in series in the negative direction in the Z direction. The number b of resistors each having a resistance value Rv is determined by the thickness b of the heat transfer member 12. Further, a resistor having a resistance value Rf is connected in series to each series circuit of resistors each having a resistance value Rv.

A thermal conduction equation is derived from this thermal network model to calculate the temperature difference V1 between the mounting surface temperature Ta and the cooling fin surface temperature Tf. As the thermal resistance between the mounting surface temperature Ta and the cooling fin surface temperature Tf decreases, the temperature difference V1 becomes smaller. The relationship between the thickness b of the heat transfer member 12 and the temperature difference V1 is derived from the thermal network model using b as a variable.

Figure 9:
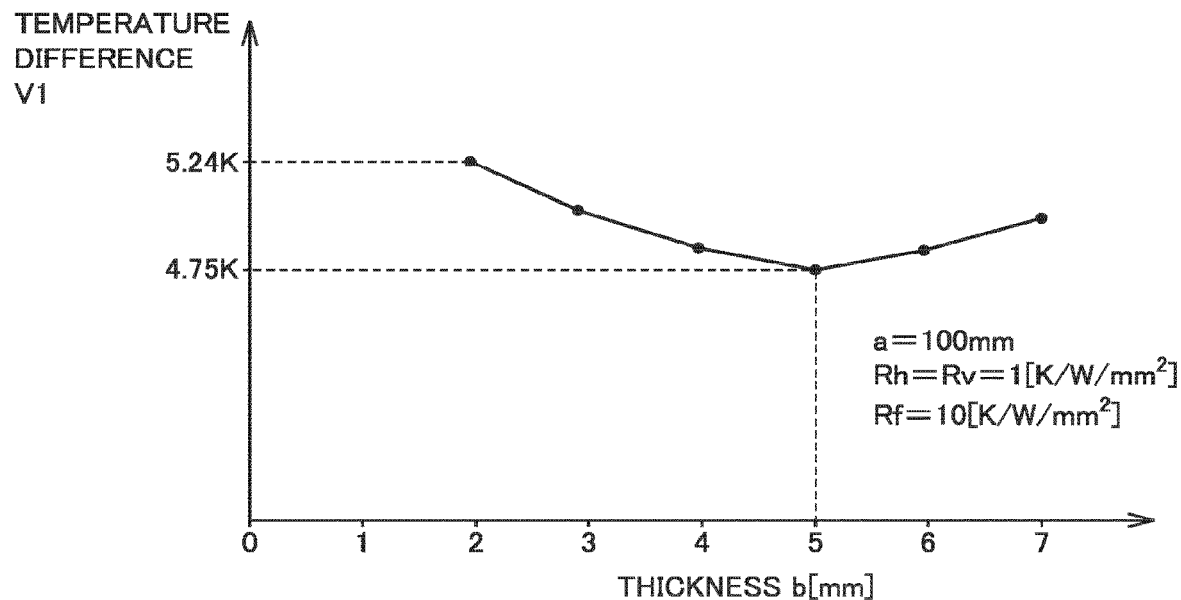
FIG. 9 is a diagram illustrating a simulation result.

FIG. 9 illustrates a simulation result. In the simulation, Rh=Rv=1 [K/W·mm$^2$], Rf=10 [K/W·mm$^2$], and a=10 mm. Under this condition, the temperature difference V1 was calculated by changing b by 1 mm each time in the range of 2 mm to 7 mm. FIG. 9 is a graph illustrating the relationship between the thickness b of the heat transfer member 12 and the temperature difference V1. In FIG. 9, the horizontal axis represents the thickness b of the heat transfer member 12, and the vertical axis represents the temperature difference V1.

As illustrated in FIG. 9, as the thickness b of the heat transfer member 12 is changed, the temperature difference V1 changes. In the example of FIG. 9, the temperature difference V1 gradually decreases as the thickness b increases from 2 mm. This tendency indicates that the thermal resistance in the X-Y direction decreases in accordance with an increase in the thickness b.

However, as the thickness b of the heat transfer member 12 exceeds 5 mm, the temperature difference V1 increases. This tendency indicates that the thermal resistance in the Z direction increases in accordance with an increase in the thickness b of the heat transfer member 12. Thus, as illustrated in the graph of FIG. 9, the temperature difference V1 is minimum as the thickness b=5 mm.

According to the simulation result of FIG. 9, it can be seen that a minimum point is present in the graph illustrating the relationship between the thickness b of the heat transfer member 12 and the temperature difference V1. In the example of FIG. 9, as the thickness b of the heat transfer member 12 is set to 5 mm, the thermal resistance (θs+θf) between the mounting surface temperature of the heat transfer member 12 and the surface temperature of the cooling fin 20 becomes minimum. Thus, if the thickness b of the heat transfer member 12 is set to 5 mm, the thermal resistance θs between the mounting surface temperature and the back surface temperature may be minimized.

Figure 10:
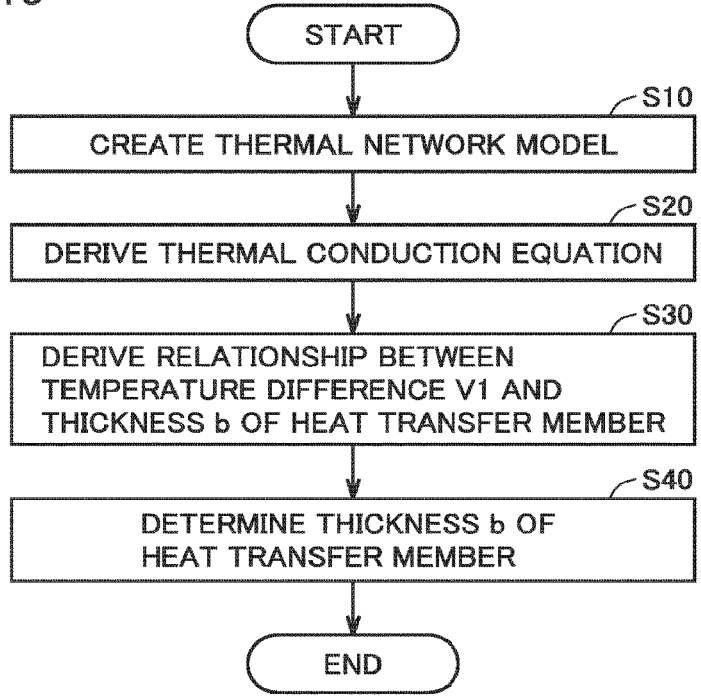
FIG. 10 is a flowchart for explaining a method of setting the thickness of the heat transfer member.

FIG. 10 is a flowchart for explaining a method of setting the thickness of the heat transfer member 12.

With reference to FIG. 10, first, a thermal network model (FIG. 8) is created for the heat transfer member 12 in step S10. In step S10, the resistance values Rh and Rv specific to the heat transfer member 12 and the resistance value Rf specific to the cooling fin 20 are acquired. A ladder-type resistor circuit is formed from resistors having resistance values Rh, Rv and Rf based on the shape of the mounting surface of the heat transfer member 12.

Next, in step S20, a thermal conduction equation is derived from the ladder-type resistor circuit formed in step S10.

In step S30, the relationship (the graph in FIG. 9) between the thickness b of the heat transfer member 12 and the temperature difference V1 between the mounting surface temperature Ta and the cooling fin surface temperature Tf is derived using the thermal conduction equation derived in step S20.

In step S40, the thickness at which the temperature difference V1 between the mounting surface temperature Ta and the cooling fin surface temperature Tf is minimum in the relationship derived in step S30 is set as the thickness b of the heat transfer member 12.

As described above, in the semiconductor device according to the present embodiment, the heat generated in the semiconductor module is transferred to the cooling fin by using the heat transfer member 12 which has the thermal conductivity in the first direction parallel to the mounting surface higher than the thermal conductivity in the second direction perpendicular to the mounting surface. Thus, the heat generated by the switching element in the semiconductor module may be diffused not only in the second direction but also in the first direction via the heat transfer member 12. As a result, the heat radiation ability of the cooling fin may be effectively utilized, which thereby improves the cooling efficiency of the semiconductor module.

Further, by setting the thickness b of the heat transfer member 12 in the second direction to the thickness at which the thermal resistance θs between the mounting surface temperature Ta and the back surface temperature Tb is minimum, it is possible to further improve the cooling efficiency of the semiconductor module.

It should be understood that the embodiment disclosed herein is merely by way of illustration and example but not limited in all aspects. The scope of the present invention is defined by the terms of the claims, rather than the description above, and is intended to include any modifications within the meaning and scope equivalent to the terms of the claims.

REFERENCE SIGNS LIST

1: AC power supply; 2: load; 3: converter; 3U, 3V, 3W: leg circuit; 4: capacitor; 5, 5U, 5V, 5W: semiconductor module; 6: controller; 10: power converter; 12, 100: heat transfer member; 20: cooling fin; Q, Q1-Q6: switching element; D1-D6: diode; T1-T3: AC input terminal; T4, T5: DC output terminal; L1: DC positive bus; L2: DC negative bus

The invention claimed is:

1. A semiconductor device comprising:
   a semiconductor module that includes a switching element and a diode connected in antiparallel to each other;
   a cooling member that cools the semiconductor module; and
   a heat transfer member that is disposed between the semiconductor module and the cooling member to transfer heat generated by the switching element and the diode to the cooling member,
   the heat transfer member having a mounting surface on which the switching element and the diode are mounted side by side and a surface which is located opposite to the mounting surface and disposed in contact with the cooling member, and
   in the heat transfer member, the thermal conductivity in a first direction parallel to the mounting surface being higher than the thermal conductivity in a second direction perpendicular to the mounting surface,
   wherein the thickness of the heat transfer member in the second direction is set based on a relationship between the thickness and a temperature difference between a temperature of the mounting surface of the heat transfer member and a surface temperature of the cooling member, the relationship being derived from a thermal network model for a ladder-type resistor circuit composed of thermal resistors in the first direction and thermal resistors in the second direction.

2. The semiconductor device according to claim 1, wherein
   as the thickness of the heat transfer member in the second direction becomes greater, the thermal resistance of the heat transfer member in the first direction becomes smaller, and the thermal resistance thereof in the second direction becomes greater.

3. The semiconductor device according to claim 1, wherein
   the thickness of the heat transfer member in the second direction is set based on the derived relationship in such a manner that the temperature difference is minimum.

4. The semiconductor device according to claim 1, wherein
   the semiconductor device is a power converter that performs power conversion between DC power and AC power by turning on and off the switching element.

5. The semiconductor device according to claim 1, wherein
   the heat transfer member is a graphite sheet.

* * * * *